(12) United States Patent
Boyksen

(10) Patent No.: US 10,632,733 B2
(45) Date of Patent: *Apr. 28, 2020

(54) AUTOMATED UV-LED EXPOSURE OF FLEXOGRAPHIC PRINTING PLATES

(71) Applicant: Flint Group Germany GmbH, Stuttgart (DE)

(72) Inventor: Frank Boyksen, Altdorf (DE)

(73) Assignee: Flint Group Germany GmbH (DE)

( * ) Notice: Subject to any disclaimer, the term of this patent is extended or adjusted under 35 U.S.C. 154(b) by 88 days.

This patent is subject to a terminal disclaimer.

(21) Appl. No.: 15/860,795

(22) Filed: Jan. 3, 2018

(65) Prior Publication Data

US 2018/0126721 A1 May 10, 2018

Related U.S. Application Data

(63) Continuation of application No. 15/015,744, filed on Feb. 4, 2016, now Pat. No. 9,889,640.

(30) Foreign Application Priority Data

Feb. 6, 2015 (EP) ..................... 15154057

(51) Int. Cl.
*G03F 7/36* (2006.01)
*B41C 1/10* (2006.01)
*G03F 7/20* (2006.01)

(52) U.S. Cl.
CPC ............ *B41C 1/10* (2013.01); *G03F 7/201* (2013.01); *G03F 7/202* (2013.01); *G03F 7/2016* (2013.01); *G03F 7/2018* (2013.01)

(58) Field of Classification Search
CPC ...................................................... B41C 1/10
See application file for complete search history.

(56) References Cited

U.S. PATENT DOCUMENTS 5,262,275 A 11/1993 Fan
8,492,074 B2 7/2013 Bryant
(Continued)

FOREIGN PATENT DOCUMENTS

DE 102010031524 A1 1/2012
EP 654150 A1 5/1995
(Continued)

*Primary Examiner* — Chanceity N Robinson
(74) *Attorney, Agent, or Firm* — Faegre Drinker Biddle & Reath LLP

(57) ABSTRACT

Method for producing flexographic printing plates from a photopolymerizable flexographic printing plate with a dimensionally stable support, photopolymerizable, relief-forming layer(s), and a digitally imagable layer. The method comprises (a) producing a mask by imaging the digitally imagable layer, (b) exposing the flexographic printing plate with a plurality of UV-LEDs on a UV-LED strip through the mask with actinic light, and photopolymerizing the image regions of the layer, and (c) developing the photopolymerized layer. In the UV-LED strip or in a separate strip, at least one ultrasonic sensor is arranged for determining the thickness of the flexographic printing plate for exposure. Depending on the measured thickness of the flexographic printing plate, the exposing of the flexographic printing plate is controlled in respect of: (i) number of exposure steps, exposure intensity, energy input per exposure step, duration of the individual exposure steps, and/or overall duration of exposure.

7 Claims, 2 Drawing Sheets

(56) References Cited

U.S. PATENT DOCUMENTS

| | | |
|---|---|---|
| 8,578,854 B2 | 11/2013 | Sievers |
| 8,772,740 B2 | 7/2014 | Klein et al. |
| 8,808,968 B2 | 8/2014 | Choi et al. |
| 2008/0280227 A1 | 11/2008 | Sievers |
| 2009/0186308 A1 | 7/2009 | Rudolph |
| 2011/0104615 A1 | 5/2011 | Sievers |
| 2012/0012224 A1 | 1/2012 | Haeuslmann |
| 2013/0017493 A1 | 1/2013 | Cook et al. |
| 2013/0242276 A1* | 9/2013 | Schadebrodt ............ G03F 1/68 355/27 |
| 2016/0108270 A1* | 4/2016 | Kosydar ................ C09D 11/38 428/208 |
| 2016/0229173 A1 | 8/2016 | Boyksen |

FOREIGN PATENT DOCUMENTS

| | | |
|---|---|---|
| EP | 1069475 A1 | 1/2001 |
| EP | 1070989 A1 | 1/2001 |
| EP | 1072953 A1 | 1/2001 |
| WO | WO-94/03838 A1 | 2/1994 |
| WO | WO-2008135865 A2 | 11/2008 |
| WO | WO-2012010459 A1 | 1/2012 |
| WO | WO-2014035566 A1 | 3/2014 |
| WO | WO-2015007667 A1 | 1/2015 |
| WO | WO-2015044437 A1 | 4/2015 |

\* cited by examiner

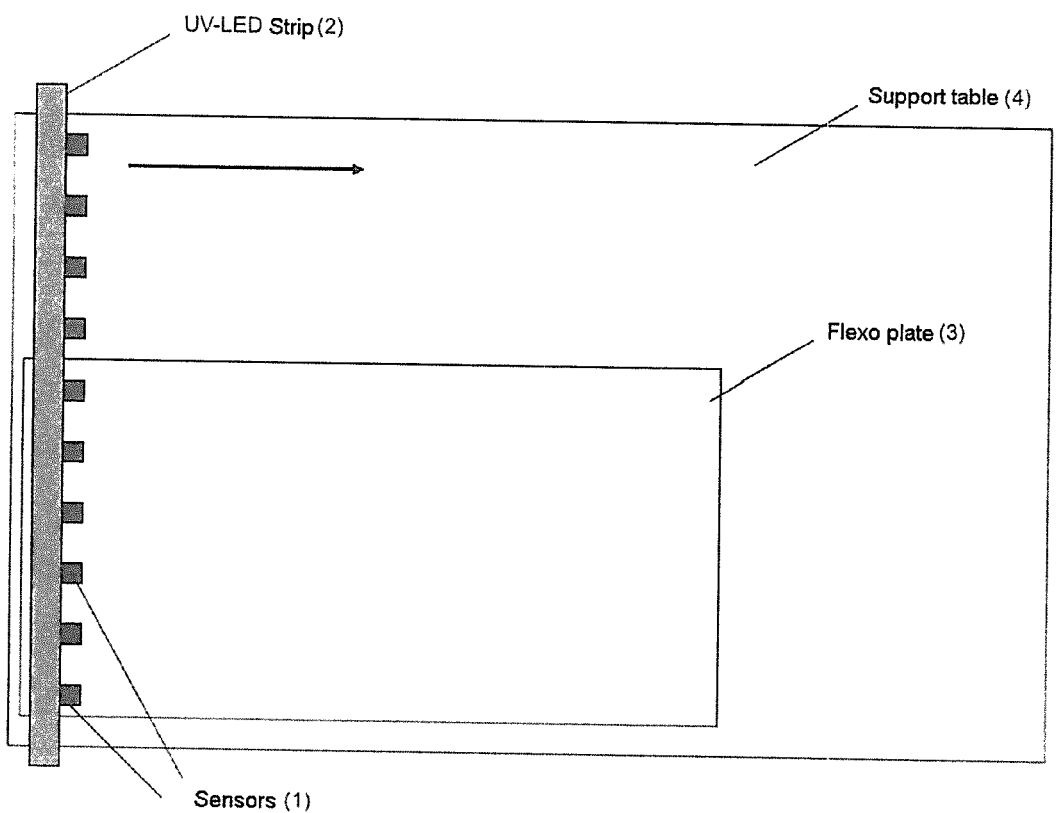

AUTOMATED UV-LED EXPOSURE OF FLEXOGRAPHIC PRINTING PLATES

This Application is a continuation of U.S. application Ser. No. 15/015,744, filed Feb. 4, 2016, which claimed priority to European Patent Application No. 15154057.2 filed on Feb. 6, 2015 in European Patent Office. The entire contents of these applications are incorporated herein by reference in their entirety.

The most widespread method for producing flexographic printing plates involves the imagewise exposure of the photopolymerizable, relief-forming layer with actinic radiation, especially longwave UV radiation, through a mask produced digitally or photographically. In a further method step, the exposed layer is treated using a suitable solvent or solvent mixture, with the unexposed, unpolymerized regions of the relief-forming layer being dissolved, while the exposed, polymerized regions are retained and form the relief of the printing plate.

Digital imaging of photosensitive flexographic printing elements is known in principle. In this context, flexographic printing elements are not produced conventionally, by placement of a photographic mask, followed by exposure through the photographic mask. Instead, the mask is produced in situ directly on the flexographic printing element by means of appropriate technologies. Flexographic printing elements may be provided, for example, with opaque, IR-ablative layers (EP-B 654 150, EP-A 1 069 475) which can be ablated imagewise by means of IR lasers. Other known technologies include layers which can be written by means of inkjet technology (EP-A 1 072 953), or layers which can be written thermographically (EP-A 1 070 989). Following the imagewise writing of these layers by means of the technologies appropriate for the purpose, the photopolymerizable layer is exposed through the resultant mask by means of actinic light.

Imagewise exposure with actinic radiation takes place on a standard basis using UV radiation sources which possess significant emission in the range from about 315 nm to 420 nm (longwave UV region to violet region of the visible spectrum). The most frequently used radiation source is UV/A tubes, which possess an emission maximum at a wavelength of about 370 nm and generate UV intensities of 10 mW/cm$^2$-30 mW/cm$^2$, measured at a distance of 50 mm (typical distance from the radiation source to the surface of the flexographic printing element). UV/A tubes of this kind are available for example under the "R-UVA TL 10R" designation from Philips. Use is also made, moreover, of mercury vapour lamps for the imagewise exposure, with preference being given to doped medium-pressure mercury vapour lamps, since doping with iron and/or gallium, for example, allows an increase in the fraction emitted in the UV/A region.

Recently, for the radiation curing of photopolymerizable compositions, there is also increasing use of LEDs (light-emitting diodes) which emit UV light.

Common LED systems for UV curing are focused presently in practice on the wavelengths 395 nm and also 365 nm. Other possible spectral ranges are 350 nm, 375 nm, 385 nm, and 405 nm. Scientific publications additionally mention the wavelengths 2:10, 250 nm, 275 nm, and 290 nm. LEDs are distinguished by a narrow intensity distribution (typically +/−10-20 nm). They have no significant warm-up phase and can be regulated to about 1% to 100% of the maximum intensity.

Using UV light-emitting diodes it is possible to achieve power levels of a few watts/cm$^2$, and the efficiency, depending on the UV LED system, is between 1% and 20%. Here it is possible to apply the following rough rule of thumb: the shorter the wavelength, the lower the efficiency. The shorter the intended emission wavelength, the higher the production costs. At the present time, LED systems for areal curing are available commercially with a wavelength of 395 nm and a UV power between 1-4 W/cm$^2$, and with a wavelength of 365 nm in the 0.5-2 W/cm$^2$ range, from various suppliers.

During the exposure of photopolymer plates with UV light through a mask produced by laser ablation, an unwanted effect which occurs is the inhibition of the polymerization as a result of oxygen, which diffuses into the photopolymer layer from the surrounding atmosphere. The same effect occurs if a layer imagable digitally by means of other technologies is employed, since these layers are generally only a few micrometers thick and hence are sufficiently thin that the oxygen from the ambient air is able to diffuse through them.

As a result of the oxygen inhibition, the surfaces of the halftone dots are rounded. Relatively small halftone dots are unable to experience sufficient polymerization, and are removed during the washing procedure. The resolution of the flexographic printing plates produced under the influence of oxygen is low.

One possibility of shutting out atmospheric oxygen during exposure is to carry out exposure under nitrogen, for example, as described in US 2009/0186308. In other processes, a film or other oxygen barrier layer is laminated on before surface UV exposure, thereby preventing subsequent diffusion of the oxygen, as described in US 2013/0017493. The barrier layer may also be integrated into the construction of the flexographic printing plate, as described in U.S. Pat. No. 5,262,275 or in U.S. Pat. No. 8,492,074, for example. Or photopolymerizable layers are described comprising adjuvants which shut out the effect of the oxygen on the crosslinking reaction, as described in U.S. Pat. No. 8,808,968. In all of the processes stated it is possible to reproduce relatively fine details on the flexographic printing plate.

One elegant process for producing high-resolution flexographic printing plates is the exposure of the flexographic printing plate by means of high-energy UV-LED radiation. In this process, the oxygen is not eliminated, but its inhibiting effect is minimized by the exposure using high-energy radiation.

WO 2012/010459, for example, describes the combined exposure of a flexographic printing plate by means of high-energy UV-LED radiation, followed by exposure with conventional UV tubes. Exposure in a flat embodiment is described.

US 2011/0104615 describes the process of UV-LED exposure preferably on a drum exposure unit, on the side of which there is mounted a UV-LED strip which moves parallel to the axis of the drum while the drum is rotating. The rotational speed of the drum and hence the energy input per exposure cycle can be varied. Through choice of the speed of rotation, the operator is able to control whether round or flat halftone clots are produced on the flexographic printing plate.

Also described is a flat embodiment of the UV-LED exposure, in which the UV-LED exposure unit is guided back and forth across the width of the printing plate, while the printing plate is displaced in the longitudinal direction.

U.S. Pat. No. 8,772,740 describes how both flat-surface halftone dots and rounded-surface halftone dots can be generated on a printing plate by means of UV-LED exposure. In this case, the printing plate is written with a laser a first time and is then exposed so as to form flat-surface halftone dots. The printing plate is then written a second time with a laser and subsequently exposed so as to form rounded halftone dots. The process, however, is very costly and inconvenient, and has therefore not become established in practice.

In U.S. Pat. No. 8,578,854, the UV-LED exposure of flexographic printing plates is described, where the UV-LED exposure unit is located in a reflector tunnel. In the reflector tunnel, the UV-LED radiation is additionally scattered, allowing halftone dots with broader anchoring to be produced. The process can be implemented for flat and round printing plates.

Lastly, WO 2014/035566 describes a flexographic printing plate which is exposed using UV-LEDs, the exposure taking place with two different wavelengths (365 nm and 395 nm). This type of exposure is said to make it possible to control anchoring, and the flank angle of the halftone dots, in order to achieve a good print outcome.

Common to all types of UV-LED exposure is the fact that there are numerous different parameters which may influence the exposure outcome. Important parameters are, for example, the distance of the UV-LED strip from the printing plate surface, the luminous power of the UV-LED strip, the emission angle, the wavelength, the advancement rate of the UV-LED strip, or, in the case of exposure on a drum, the rotation rate, the total energy input into the photopolymerizable layer, and, in the case of multiple partial exposure, the energy input per partial exposure.

These various parameters allow the exposure outcome to be controlled and, for example, tailor-made exposure settings to be realized for different print applications. Accompanying the variability of UV-LED exposure, however, is a high susceptibility to error. If only one parameter is not correctly set, the processed plate is unusable.

It is an object of the invention, therefore, to provide an automated method for the UV-LED exposure of flexographic printing plates, which permits a diversity of different types of exposure but which minimizes the frequency of errors.

The object is achieved by a method for producing flexographic printing, plates, using as starting material a photopolymerizable flexographic printing plate which at least comprises, arranged one above another,
  a dimensionally stable support,
  at least one photopolymerizable, relief-forming layer, at least comprising an elastomeric binder, an ethylenically unsaturated compound and a photoinitiator,
  a digitally imagable layer, comprising at least the following steps:
(a) producing a mask by imaging the digitally imagable layer,
(b) exposing the flexographic printing plate through the mask with actinic light, and photopolymerizing the image regions of the layer, the exposing taking place with a plurality of UV-LEDs which are arranged on at least one UV-LED strip which is moved relative to the surface of the flexographic printing plate, and
(c) developing the photopolymerized layer by washing out and drying or by thermal development,
characterized in that
  in the UV-LED strip or in a separate strip, at least one ultrasonic sensor is arranged,
  at least the thickness of the flexographic printing plate for exposure is determined with the at least one ultrasonic sensor,
  depending on the measured thickness of the flexographic printing plate, the exposing of the flexographic printing plate is controlled in respect of at least one of the following parameters:
  (i) number of exposure steps,
  (ii) exposure intensity,
  (iii) energy input per exposure step,
  (iv) duration of the individual exposure steps,
  (v) overall duration of exposure.

The control of the exposure takes place preferably in relation to a plurality of parameters (i)-(v), more preferably in respect of all parameters (i)-(v).

Depending on the measured thickness of the flexographic printing plate, control is exerted over the number of exposure steps, the exposure intensity, and the energy input per exposure step. The energy input per exposure step is a product of the exposure intensity and of the rate at which the UV-LED strip is displaced relative to the plate surface. This rate and the length of the flexographic printing plate determine the duration of an exposure step. Depending on the measured length of the flexographic printing plate, the overall duration of exposure can be regulated by means of breaks between the individual exposure steps.

The total energy (J/cm$^2$) input into the photopolymerizable layer throughout exposure (b) is set according to the reactivity of the printing plate. Typical energies needed for the crosslinking of a flexographic printing plate are in the range from 5 to 125 J/cm$^2$.

In one preferred embodiment of the invention, the overall energy input into the photopolymerizable, relief-forming layer in step (b) is 5 to 25 J/cm$^2$.

Generally speaking, the UV-LEDs used in step (b) have an emission maximum in the wavelength range of 350-405 nm, for example at 350 nm, 365 nm, 375 nm, 385 nm, 395 nm or 405 nm. The power of the UV-LED strip is preferably in a range from 500 to 5000 mW/cm$^2$.

This energy is preferably not input into the photopolymerizable layer in one exposure step, but is instead distributed over a number of partial exposures (exposure steps); preferably, at least 3 partial exposures are carried out.

It has been found that in the exposure of the photopolymerizable layer with high exposure intensity by means of UV-LEDs, the phenomenon known as "cupping" of the halftone dots of the printing relief layer can be minimized, and the depths between the halftone dots can be enlarged, if the overall exposure energy is introduced not in a single exposure step, but is instead distributed over a number of exposure steps.

Generally speaking, the UV-LED strip is moved with a relative speed of 50 to 5000 mm/min parallel to the surface of the flexographic printing element.

Accordingly, depending on the printing plate thickness measured by the at least one ultrasonic sensor, adjustments are made to the number of exposure steps, the duration of an individual exposure step, and the energy input per exposure step, by displacement of the UV-LED strip at a rate in the range from 50 mm/min to 5000 mm/min relative to the surface of the flexographic printing plate.

Generally speaking, the at least one ultrasonic sensor also determines the distance of the UV-LED strip from the surface of the flexographic printing plate, and the UV-LED strip is positioned at a defined distance from the surface of the flexographic printing plate.

In one preferred embodiment of the method of the invention, there are a plurality of ultrasonic sensors arranged in the UV-LED strip, in order, additionally, to measure the width of the flexographic printing plate for exposure. In the exposure of the flexographic printing plate, in that case, only the UV-LEDs necessary for exposure, corresponding to the measured width, are switched on.

In a further preferred embodiment, the width of the flexographic printing plate is measured with only one ultrasonic sensor. This sensor can be displaced along the UV-LED strip.

In another preferred embodiment of the method of the invention, before UV-LED exposure, an additional determination is also made of the length of the flexographic printing plate for exposure. Accordingly, the exposure program can be harmonized optimally with the format of the flexographic printing plate.

In one embodiment of the invention, the energy input per exposure step remains constant over the total duration of the exposure (b). For example, 10 to 50 exposure steps are carried out with an energy input of 0.1 to 1 J/cm².

In one preferred embodiment, the energy input per exposure step increases over the total time of the exposure (b); in other words, a higher energy is input in a later exposure step than in an earlier exposure step.

In one preferred embodiment, a plurality of exposure steps with low energy input are carried out first of all, and subsequently one or more exposure steps with higher energy input. For example, first 10 to 40 exposure steps with an energy input of 0.1 to 1 J/cm² and then 1 to 5 exposure steps with 2 to 5 J/cm² are carried out.

The individual exposure steps are realized by moving the at least one UV-LED strip parallel to the surface of the flexographic printing element. In this case the UV-LED strip or strips may be mobile or the UV-LED strips may be fixed and the surface of the flexographic printing element may be mobile, or both possibilities may be realized.

In one embodiment of the method of the invention, the flexographic printing plate is moved. In a preferred embodiment of the method of the invention, the flexographic printing plate is moved and one UV-LED strip is arranged movably, while another UV-LED strip is arranged fixedly. In this embodiment of the invention, the plurality of UV-LEDs are arranged alongside one another on at least two UV-LED strips, of which at least one is movable and at least one is fixed. In this arrangement, one or more ultrasonic sensors may be arranged on one or more UV-LED strips, in order to adjust the distance of the UV-LED strips relative to the flexographic printing plate, and to obtain the flexographic printing plate format for exposure.

In one preferred embodiment of the invention, the exposing encompasses a plurality of exposure steps, the UV-LED strip being displaced at different rates relative to the flexographic printing plate.

If the exposing encompasses a plurality of exposure steps, the overall duration of exposure, depending on the length of the flexographic printing plate, may be adjusted by breaks between the individual exposure steps. This is advantageous when flexographic printing plates having different dimensions are to be exposed. By maintaining breaks between the individual exposure steps, in the exposure of relatively small flexographic printing plates, the overall duration of exposure can be kept constant, and smaller and larger flexographic printing plates can be exposed with an identical exposure program, thus producing identical exposure results.

In one preferred embodiment of the invention, the exposure comprises a plurality of exposure steps, the UV-LED strip being movable and being passed back and forth between a start position and an end position relative to the flexographic printing plate.

In one variant the UV-LED strip is switched off when being moved from the end position into the starting position.

In a further variant, the UV-LED strip is not switched off on being displaced from the end to the start position.

The invention is elucidated in more detail below with reference to the figures. The drawings show the following:

FIG. 2 shows, diagrammatically, a preferred embodiment with a plurality of ultrasonic sensors in the UV-LED strip.

Figure 1:
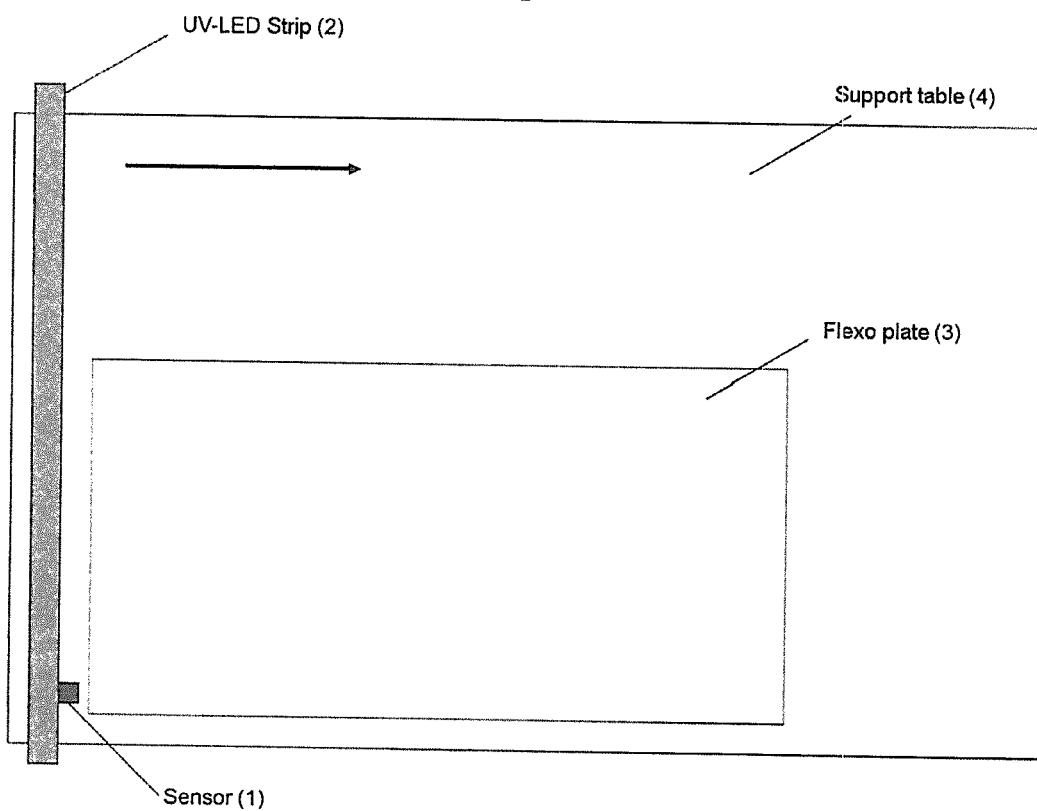
FIG. 1 shows, diagrammatically, an embodiment with only one ultrasonic sensor in the UV-LED strip.

Exposure (b) is performed preferably on an XY stage having a width X and a length Y, by means of one or more UV-LED strips which are moved along the surface of the flexographic printing plate. FIG. 1 shows a diagrammatic drawing of an XY stage with a UV-LED strip. The UV-LED strip 2 customarily extends over the entire width of the XY stage, thereby covering the entire width of the exposure unit 4. During exposure, the UV-LED strip is moved with a defined advancement rate over the entire length of the printing plate 3. The length thereof may amount, for example, to 2 m. Exposure may take place in one pass or in a plurality of passes (exposure steps). During such treatment, the advancement rate may be kept constant or varied. Between the individual partial exposures (exposure steps) there may be breaks. The partial exposures may be accomplished by displacing the switched-on UV-LED strip only in one direction or traversingly (by passing the switched-on UV-LED strip back and forth).

A typical UV-LED strip is constructed from individual LED arrays, consisting each of 4 LEDs in a square arrangement, thus emitting a uniform luminous intensity over the entire length of the LED strip. In a typical LED strip 1 m long, for example, there are a total of 125 LED arrays arranged, corresponding to 500 individual LEDs. Customarily 10 to 20 LED arrays are assembled in each case into individual modules. These modules can be driven separately.

In one embodiment an ultrasonic sensor 1 is mounted on the leading side of the UV-LED strip 2 and allows measurement of the thickness of the flexographic printing plate for exposure. When the UV-LED strip runs over the flexographic printing plate ahead of the actual exposure, the ultrasonic sensor 1 can also be used to detect the length of the flexographic printing plate for exposure. If the ultrasonic sensor 1 is mounted movably on the UV-LED strip and can be displaced along the UV-LED strip, then an ultrasonic sensor can be used to detect the thickness of the flexographic printing plate for exposure, and also its length and width.

In the preferred embodiment shown in FIG. 2, an ultrasonic sensor 1 is mounted for each driveable LED module, providing for automatic detection not only of the distance of the UV-LED strip from the plate surface but also of the width and length of the flexographic printing plate for exposure, if the UV-LED strip is displaced over the flexographic printing plate ahead of the actual exposure.

In a further arrangement according to the invention, the sensors 1 are mounted on both sides of the UV-LED strip 2, enabling automatic control in the traversal operation of the UV-LED strip as well.

The sensors are connected to a control unit. This control unit adjusts the distance of the UV-LED strip from the surface of the flexographic printing element, and also controls all other parameters of the exposure operation (exposure intensity, advancement rate of the strip, on and off switching of the UV-LED strip, number of exposure steps, breaks between individual exposure steps).

For example, the method of the invention can be carried out in such a way that the flexographic printing element 3 for exposure is positioned in a corner of the XY stage 4 prior to exposure. The UV-LED strip 2 then travels a few cm over the plate, with the sensors 1 detecting the width of the flexographic printing element and also its thickness. The data determined by the sensors is transmitted to the control unit. The UV-LED strip travels back into the start position again. The exposure program stored in the control unit for the relevant plate thickness is then started.

The UV-LED strip starts with the particular selected advancement rate. As soon as the sensors detect the edge of the printing plate, the UV-LED strip switches on automatically, with the luminous power selected by the exposure program. In order to save energy, only those LED modules which are located above the printing plate are switched on. As soon as the sensors detect the end of the printing plate, the UV-LED strip switches off automatically and travels at maximum advancement rate back into the start position. After a break, where necessary, the next partial exposure starts, with the luminous power and advancement rate stored in the exposure program. These operations are repeated until the exposure program stored in the control unit has run to completion.

As an alternative to this, prior to the exposure, the UV-LED strip can be displaced over the entire flexographic printing plate and is able accordingly to detect the format of the flexographic printing plate for exposure.

In order to produce optimum halftone dot forms, it may further be necessary to raise the energy input of the partial exposures in the course of the exposure procedure. For example, first of all a plurality of partial exposures are carried out with high advancement rate (i.e. low energy input), followed by a partial exposure with a low advancement rate (i.e. high energy input). Alternatively, the advancement rate is lowered continuously or the energy input of the partial exposures is raised continuously in the course of the exposure procedure.

The processes which occur in the printing plate during irradiation with UVA light are complex and have different consequences, depending on the thickness of the photopolymerizable, relief-forming layer of the flexographic printing plate. A number of processes are running in parallel, and must be considered in three dimensions, in order to be able to explain and influence the development of the optimum halftone dot geometry for subsequent printing.

Following absorption of the UVA light, a photoinitiator molecule present in the printing plate breaks down into two radicals. The radicals produced react in a radical chain reaction with the low molecular mass crosslinker that is present in the printing plate. Since the crosslinker is polyfunctional, the polymerization results in the formation of networks, which cause insolubility in the exposed regions of the printing plate. The speed of the photopolymerization is generally very quick and is dependent in a first approximation on the concentration of the available crosslinker and of the available radicals.

Radical chain reactions are inhibited by the presence of oxygen, since oxygen scavenges reactive radicals and converts them into more stable radicals which are no longer available for further polymerization.

In the case of typical tube exposure, the printing plate is irradiated for a time of around 10 minutes with UVA light of low power (around 20 mW/cm$^2$). At this low power, the rate of the chain initiation reaction is in the same order as the rate of the chain termination reaction. In the exposed regions of the printing plate, therefore, the termination reaction with oxygen proceeds as a competing reaction to the polymerization initiated by formation of radicals. Oxygen from the ambient air is able to diffuse subsequently at the surface of the printing plate. In the case of tube exposure, therefore, halftone dots on the surface of the printing plate are usually not imaged exactly, but instead have rounded dot surfaces. The skilled person refers to round-top dots (RTDs).

In the case of UV-LED exposure, higher radiation doses are input into the plate in a very much shorter time. In the case of a typical UV-LED exposure, the irradiated power is around 1000 mW/cm$^2$. At a customary irradiation width of about 30 mm and with rates of advance of 100 to 5000 mm/min, the exposure time is below one minute, usually in the region of a few seconds. Under these conditions, the concentration of the radicals generated by absorption of light in the exposed regions of the photopolymerizable layer is higher by orders of magnitude than in the case of tube exposure. The chain initiation reaction is very much quicker than the chain termination reaction. The oxygen that is present in or diffuses subsequently into the photopolymerizable layer is no longer able to exert any substantial influence over photopolymerization. The halftone dots are therefore imaged exactly to the boundary of the unexposed region. Halftone dots with sharp edges are produced. The skilled person refers to flat-top dots (FTDs).

In accordance with the invention, exposure can take place in such a way that FTD halftone dots are produced. The chain initiation reaction is very much quicker than the oxygen-mediated chain termination reaction. Nevertheless, the presence of oxygen and its subsequent diffusion still play a considerable part at the boundary between exposed and unexposed regions of the printing plate.

Without being tied to any particular theory, it is thought that there is a further effect to be considered under UV-LED exposure conditions. As a result of the high exposure intensity, there is a sudden depletion of crosslinker in the exposed regions of the printing plate. The reaction subsequently proceeds under diffusion control, and is fed by diffusion of the crosslinker from the adjacent, unexposed regions. The diffusion of the crosslinker, however, is comparatively slow, and therefore acts only in a narrow region around the boundary between image and nonimage regions. As a result of the diffusion of the crosslinker, at the boundary between unexposed and exposed regions of the printing plate, there is significant transport of material, which substantially determines the shape of the halftone dot and in particular the edges of the halftone dot. The phenomenon of the formation of measurable edges at the boundaries of the image elements is known to the skilled person. It is referred to as cupping. The correlation of the phenomenon of cupping with the diffusion of the crosslinker in the photopolymerizable layer has not hitherto been acknowledged, however.

Accordingly, in the exposure of flexographic printing plates with high-energy UV-LED radiation, there is competition between processes of (1) light absorption and radical formation, (2) polymerization, (3) diffusion of oxygen into the photopolymerizable layer and chain termination, and (4) diffusion of the crosslinker in the photopolymerizable layer, and the interplay of these processes, also depending on the thickness of the flexographic printing plate, determines the shape of the relief elements and hence also their printing characteristics.

The luminous intensity at the level of the surface of the flexographic printing plate is measured using a suitable, calibrated UV measuring device, the sensor of the measuring device being placed at the same distance from the radiation source as the plate surface would be from the radiation source. Suitable UV measuring devices are available commercially from a variety of suppliers. Important factors here are that the measuring device is calibrated and sensitive within the UV wavelength range under test.

If a flexographic printing plate is to be exposed with a plurality of partial exposures with high advancement rate, it is sensible to displace the UV-LED strip back and forth and in this case not to switch off the UV-LED strip as it travels back into the start position; in this way, a significant time saving can be achieved.

Particularly in the case of relatively thick flexographic printing plates, it may be necessary to combine the UV-LED exposure with a subsequent surface exposure by means of UVA tubes. These tubes may be mounted above the XY stage and may be started automatically by the control unit as soon as the UV-LED exposure is at an end.

In one embodiment of the method of the invention, therefore, after step (b), additionally, exposure takes place with a UVA tube exposure unit.

An individual exposure program can be stored in the control unit for each type of plate defined by its thickness, thereby eliminating the possibilities for error. Similarly, different exposure programs can be saved for different plate formats, thereby again eliminating possibilities for error and permitting economic exposure, i.e. extremely rapid exposure, to be realized.

UV-LED Strip

The power of the UV-LED strip is preferably in a range from 500 to 5000 mW/cm$^2$, more preferably in a range from 600 to 2000 mW/cm$^2$. This power is determined with a UVA meter at a distance of 10 mm between measuring sensor and protective window of the LED strip. For this purpose, the measurement sensor is positioned on the base plate of the exposure unit and the light-emitting UV-LED strip is run over the sensor, which records an intensity profile whose maximum corresponds to the exposure intensity. The luminous power irradiated at the surface of the flexographic printing plate is correspondingly lower when there is a greater distance between UV-LED strip and irradiated surface, and correspondingly higher when there is a smaller distance between UV-LED strip and irradiated surface. The power (luminous intensity) irradiated at the surface of the flexographic printing plate, in accordance with the invention, is 100 to 5000 mW/cm$^2$, preferably 500 to 5000 mW/cm$^2$, and more preferably 600 to 2000 mW/cm$^2$. Possible wavelengths of the UV-LED strip are 355 nm, 365 nm, 375 nm, 395 nm and 405 nm; a preferred wavelength is 365 nm.

A typical UV-LED strip possesses a beam window width of about 10 mm and is constructed from linearly arranged LED arrays, consisting each of 4 LEDs in a square arrangement, thus emitting a uniform luminous intensity over the entire length of the LED strip.

In a typical LED strip 1 m long, for example, there are a total of 125 LED arrays arranged, corresponding to 500 individual LEDs. 10 to 20 LED arrays in each case are assembled in each case to give individual modules. These modules can be replaced relatively easily and can be separately driven—that is, switched on and off or regulated in terms of luminous power.

The UV-LED arrays may also be arranged in an offset manner in order to irradiate a greater area. In that case, however, the UV-LED strip must be fitted with mirrors, preferably at the sides, in order to ensure uniform illumination of the irradiated area.

The UV-LED strip typically emits light with a certain emission angle. Typical emission angles are in a range from 20 to 70 degrees; in the case of UV-LED strips of linear construction, they are in a range from 20 to 40 degrees. The width of the irradiated area element can be calculated from the beam window width, the emission angle and the distance of the LED strip from the surface of the printing plate.

The distance of the strip from the surface of the printing plate is usually 5 mm to 100 mm, preferably 5 to 30 mm. With a typical UV-LED strip having a beam window width of about 10 mm, the width of the irradiated area element is in a range from 15 to 100 mm, or between 15 and 40 mm in the case of a small distance of about 10 mm from the plate surface.

The rate at which the UV-LED strip is moved relative to the surface of the flexographic printing plate is in the range from 50 mm/min to 5000 mm/min, preferably from 100 mm/min to 5000 mm/min.

The energy input per partial exposure can then be determined from the width of the irradiated surface element and the measured luminous power and the selected advancement. For example, in the case of an LED exposure unit UVA power of 800 mW/cm$^2$, an irradiated surface element width of 25 mm and a typical advancement rate of 250 mm/min, the irradiation time is 6 seconds and the energy input is 4.8 J/cm$^2$.

Ultrasonic Sensor

The sensors mounted on the UV-LED strip or on a separate strip are based on the reflection of ultrasound waves and in general supply linear analogue signals as a function of the plate thickness. Measurement may be carried out reliably, for example, of the thicknesses of all commercial flexographic printing plate types, using ultrasonic sensors from the company Pepperl and Fuchs, 68307 Mannheim, Germany.

According to the invention at least one ultrasonic sensor in each case is mounted on the UV-LED strip or strips or on a separate strip. Where not only the plate thickness and plate length but also the width of the flexographic printing plate for exposure are to be detected, there is preferably one thickness sensor arranged per UV-LED module on the UV-LED strip. Alternatively, the ultrasonic sensor may also be mounted movably on the UV-LED strip or on the separate strip, and the width of the flexographic printing plate for exposure can be ascertained by displacing the sensor along the UV-LED strip or the separate strip. At the exposure stage, only the modules required for exposure are switched on. In this way, a considerable quantity of energy can be saved, particularly when exposing small plate formats.

If the flexographic printing plates are to be exposed by means of a UV-LED strip not only in one direction, but also in traversal mode, it is advisable to install a further ultrasonic sensor on the trailing side of the UV-LED strip. Since this sensor serves only to switch the UV-LED strip on and off in the case of the backward movement, respectively, a measuring sensor is sufficient here.

Flexographic Printing Plate Processing

Generally speaking, the flexographic printing plate is subjected to preliminary exposure from the reverse. For this purpose, before step (b) is performed, the layer of photopolymerizable material is pre-exposed with actinic light through the UV-transparent support film, from the reverse of the photopolymerizable flexographic printing plate. Preliminary reverse exposure is carried out preferably in the case of flexographic printing plates having a thickness of ≥1 mm, this figure relating to the sum total of dimensionally stable support film and photopolymerizable layer.

Generally speaking, preliminary reverse exposure takes place using a UV tube or a UV emitter.

The photopolymerizable flexographic printing plate used as starting material comprises—arranged above one another—at least
- a dimensionally stable support, and
- at least one photopolymerizable, relief-forming layer, at least comprising an elastomeric binder, an ethylenically unsaturated compound, and a photoinitiator,
- a digitally imagable layer.

If preliminary reverse exposure of the flexographic printing plate is to be carried out, the dimensionally stable support must be transparent to UV light. Preferred supports are polymeric films made from PET or other polyesters.

The flexographic printing plate further comprises at least one photopolymerizable, relief-forming layer. The photopolymerizable, relief-forming layer may be applied directly on the support. Between the support and the relief-forming layer, however, there may also be other layers, such as adhesion layers and/or resilient underlayers.

Between the support film, optionally coated with an adhesion layer, and the photopolymerizable, relief-forming layer there may be an elastomeric support layer. The support layer may optionally be compressible or photochemically crosslinkable.

The photopolymerizable, relief-forming layer comprises at least one elastomeric binder, an ethylenically unsaturated compound, a photoinitiator or a photoinitiator system, and also, optionally, one or more further components, examples being plasticizers, processing assistants, dyes, and UV absorbers.

Elastomeric binders for producing flexographic printing elements are known to the skilled person. Examples include styrene-diene block copolymers, ethylene-acrylic acid copolymers, polyethylene oxide-polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber, or ethylene-propylene-diene rubber (EPDM). It is preferred to use hydrophobic binders. Binders of this kind are soluble or at least swellable in organic solvents, whereas in water they are largely insoluble and are also not swellable, or at least not substantially swellable, in water.

One preferred embodiment uses a binder of the styrene-butadiene type. Particularly preferred binders are linear, radial, or branched block copolymers of the styrene-butadiene type. These block copolymers have an average molecular weight $M_w$ (weight average) of 80 000 to 250 000 g/mol, preferably 80 000 to 150 000 g/mol, and more preferably of 90 000 to 130 000 g/mol, and have a styrene content of 20% to 40% by weight, preferably 20% to 35% by weight, and more preferably of 20% to 30% by weight.

In another preferred embodiment, the binder is of the styrene-isoprene type. Preferred binders of the styrene-isoprene type contain generally 13% to 40% by weight, preferably 13% to 35% by weight, and more preferably from 14% to 30% by weight of styrene.

The total amount of binders in the case of the relief-forming layer is typically 40% to 90% by weight, relative to the sum of all of the constituents of the relief-forming layer, preferably 40% to 80% by weight, and more preferably 45% to 75% by weight.

In the case of an optionally present elastomeric support layer, the total amount of elastomeric binders may be up to 100% by weight. Typically it is 75% to 100% by weight, preferably 85% to 100% by weight, and more preferably 90% to 100% by weight.

The photopolymerizable, relief-forming layer further comprises, in a known way, at least one ethylenically unsaturated compound which is compatible with the binders. Suitable compounds have at least one ethylenically unsaturated double bond and are polymerizable. They are therefore referred to below as monomers. Having proven particularly advantageous are esters or amides of acrylic acid or of methacrylic acid with mono- or polyfunctional alcohols, amines, amino alcohols or hydroxyl ethers and hydroxyl esters, esters of fumaric or maleic acid, vinyl ethers, vinyl esters, or allyl compounds. The amount of monomers in the photopolymerizable, relief-forming layer is generally not more than 20% by weight, relative to the amount of all constituents, and in general is between 3% and 15% by weight.

In a way which is known in principle, the photopolymerizable, relief-forming layer further comprises at least one photoinitiator or a photoinitiator system. Examples of suitable initiators are benzoin or benzoin derivatives, such as methylbenzoin or benzoin ethers, benzil derivatives, such as benzil ketals, acylarylphosphine oxides, acylarylphosphinic esters, α-hydroxy ketones, polycyclic quinones, or benzophenones. The amount of photoinitiator in the relief-forming layer is generally 0.1% to 5% by weight, relative to the amount of all of the constituents of the relief-forming layer.

The elastomeric support layer may likewise comprise the aforementioned ethylenically unsaturated compounds and the aforementioned photoinitiators, and preferably does comprise them, and is therefore photopolymerizable like the relief-forming layer. Generally speaking, the amount of ethylenically unsaturated compounds in the support layer is 0% to 15% by weight. In general the amount of photoinitiator in the support layer is 0% to 5% by weight.

The relief-forming layer and optionally the optional elastomeric support layer may comprise plasticizers. Mixtures of different plasticizers can be used as well. Preference is given to polybutadiene oils, more particularly those having a molecular weight of between 500 and 5000 g/mol, high-boiling aliphatic esters such as, more particularly, esters of alkylmonocarboxylic and dicarboxylic acids, examples being stearates or adipates, and mineral oils. The amount of an optionally present plasticizer is determined by the skilled person in accordance with the desired properties of the layer. In general it will not exceed 50% by weight of the sum total of all of the constituents of the photopolymerizable, relief-forming layer; in general it is 0% to 50% by weight, preferably 0% to 40% by weight.

The thickness of the photopolymerizable layer is generally 0.4 to 7 mm, preferably 0.5 to 4 mm, and more preferably 0.7 to 2.5 mm.

The imaging of the digitally imagable layer is performed by means of digital masks. Masks of this kind are also known as in situ masks. For this purpose, a digitally imagable layer is first applied to the photopolymerizable, relief-forming layer. The digitally imagable layer is preferably an IR-ablative layer, inkjet layer or layer which can be written thermographically. The digitally imagable layer is preferably a layer which can be ablated using an IR laser (IR-ablative layer).

IR-ablative layers and masks are opaque to the wavelength of actinic light and typically comprise at least one binder, an IR absorber such as carbon black, for example, and also an absorber for UV radiation; the function of the IR absorber and UV absorber may also be performed by just one substance, as is the case, for example, when carbon black is used as IR absorber. A mask can be written into the IR-ablative layer by means of an IR laser—in other words, at the points at which it is struck by the laser beam, the layer is decomposed and ablated. Irradiation can take place image-wise with actinic light through the resultant mask.

In the case of inkjet layers, a layer which can be written with inkjet inks, such as a gelatin layer, is applied. This layer is imagable by means of inkjet printers.

Thermographic layers are layers comprising substances which turn black in colour under the influence of heat. Layers of this kind comprise, for example, a binder and an organic silver salt, and can be imaged by means of a printer with a thermal head or by means of IR lasers.

Optionally there may be further functional layers located between the digitally imagable layer and the relief-forming layer. For example, a thin, oxygen barrier layer, or a rough functional layer provided with matting agents, giving the flexographic printing plate a defined surface roughness, may be present.

The method of the invention can be carried out by inserting the starting material first into a receiving unit, by means, for example, of placing it onto a conveyor belt or charging the magazine. If the starting material has a protective sheet, then, unless the receiving unit has an automatic removal means, said sheet must be removed.

In the method step (a), the digitally imagable layer is imaged in an imaging unit by means of the technology required in each case. The image information is taken directly from a control unit.

In the method step (b), the imaged flexographic printing plate is irradiated by means of the exposure unit through the mask that has been produced, using actinic light—that is, chemically active light.

During the irradiation of flexographic printing plates by means of UV-LED strips within the stated power range, there may be local, severe heating of the printing plate. Particularly in the case of a slow operation and high power, temperatures of up to 80° C. may be reached in the printing plate for short periods. Simply in order to limit the temperature increase, it may be necessary to divide the overall exposure into a plurality of partial exposures (exposure steps). Furthermore, it may be advantageous to provide an air knife for cooling between LED strip and printing plate surface. In one embodiment of the invention, the air knife is synchronized with the switching on and off of the UV-LED strip. Furthermore, the baseplate of the exposure unit may be provided with cooling, in order to allow the heat generated by absorption and chemical reaction to be removed again quickly.

If the printing plate is exposed in a plurality of partial exposures by means of UV-LED, the energy input per exposure passage is between 0.1 and 5 J/cm². In this case, the input energy of the partial exposures may be kept constant (constant advancement rate) or may be increased in the course of exposure (decreasing advancement rate). Printing investigations show that it may be advantageous to carry out a plurality of partial exposures with high advancement rate (low energy input) and thereafter to carry out one or more partial exposures with slow advancement rate (high energy input). For example, first 10 to 40 exposure cycles with an energy input of 0.1 to 1 J/cm² and then 1 to 5 exposure cycles with 2 to 5 J/cm² are carried out.

The type of exposure optimized for a type of printing plate and a format of printing plate cannot necessarily be transposed to a different format. If an exposure program optimized for a large printing plate format, with a plurality of partial exposures, is to be transposed to a smaller format, it may indeed be possible to adopt the optimum advancement rates. In order to obtain identical outcomes in the exposure of the smaller format, however, it is then necessary to provide corresponding breaks between the partial exposures, so that the overall duration of the exposure process is the same for both large and small flexographic printing plates.

Different exposure programs can be stored in the control unit for each type of flexographic printing plate. For one type of printing plate, for example, a program can be stored which yields the best results in high-quality halftone printing on film (high quality setting). This exposure program may be supplemented by a second program, which allows a short overall exposure time with good print outcomes (commercial setting).

The exposure method of the invention allows further embodiments as well. For example, plates of different thicknesses can be exposed in parallel. In this embodiment, the height setting is corrected automatically as soon as the UV-LED strip and the ultrasonic sensor have reached the second flexographic printing plate. Where two or more flexographic printing plates are placed on the XY stage at a distance, a "skip" function can be activated. This allows rapid bridging of the distance between the printing plates, with the UV-LED strip switched off.

Of course, the UV-LED exposure in accordance with the invention, with automatic detection of thickness and format, is not confined to embodiments in which the printing plate remains fixedly on the XY stage and the UV-LED strip moves over it.

Particularly in an automatic plate processing system, in which the printing plate is transported at a constant rate and undergoes the individual processing steps, the individual exposure steps will be realized with a plurality of fixed UV-LED strips beneath which the plate passes. Here as well, one or more UV-LED strips may be equipped with sensors which detect the distance of the strips from the printing plate surface and which control the exposure process. Detection of the thickness of the flexographic printing plates can also be employed for the purpose of automatic setting of the wash-out rate and automatic height setting of the wash brushes in the subsequent wash-out unit, or for setting the drying time in the downstream drying step.

In another variant of an automatic plate processing system, the printing plate is transported at a constant rate, and the UV-LED strip, equipped with sensors, is displaced back and forth in the transport direction at a higher rate than the transport rate, in order to realize exposure cycles with low energy input. The UVA-LED strip is subsequently be displaced into a stationary position at the end of the exposure section, in which an exposure step with higher energy input is realized. Since the power of a UV-LED strip is almost infinitely regulatable, numerous variants are possible here.

Alternatively, the partial exposures with low energy may also be realized such that a UV-LED strip is mounted longitudinally to the web direction and is moved back and forth, and at the end of the exposure section a second or third UV-LED strip is then run through transverse to the transport direction. The recognition of the printing plate thickness and of the printing plate format prior to exposure may also take place in this variant. In this embodiment as well, for the purpose of controlling the UV-LED strips and for switching the UV-LED strips on and off, one or more ultrasonic sensors are mounted on each of the UV-LED strips.

The exposure method of the invention is not confined to flat embodiments. The UV-LED exposure may also be realized in a drum on which the flexographic printing plate for exposure has been mounted. Following recognition of thickness and format by the ultrasonic sensors, the distance of the UV-LED strip from the printing plate surface is corrected, and the programmed exposure method is started by the control unit. Different energy inputs and advancement rates can be realized here via the power control of the UV-LED strip and via different speeds of rotation of the drum. In this method, not only flat flexographic printing plates but also cylindrical flexographic printing plates can be processed.

Generally speaking, a preliminary reverse exposure of the flexographic printing element is also carried out ahead of UV-LED exposure. For this purpose, the flexographic printing plate is irradiated from the reverse by means of UV light. The reverse UV exposure may be realized by means of UV tubes or else by means of UV-LED exposure. This step as well can be realized in a main UV-LED exposure unit. For that purpose, the bed of the UV-LED exposure unit must be UV transparent—must be made of glass, for example.

In a method step (c), the imagewisely imaged and exposed flexographic printing plate is developed by means of a suitable solvent or solvent combination. In this case the unexposed regions, i.e. those covered by the mask, in the relief layer are removed, while the exposed—i.e. cross-linked—regions are retained. Moreover, the remainders of the digitally imagable layer are removed.

The developing step is carried out typically at temperatures above 20° C. For reasons of safety and to reduce the cost and complexity of the developing apparatus involved, the temperature when using organic solvents ought to be 5° C. to 15° C. beneath the flash point of the washing agent mixture used.

The flexographic printing plate can be dried in a method step (d). Where the flexographic printing plate has a PET film support, drying takes place preferably at a temperature of 40 to 80° C., more preferably at 50 to 70° C. Where the dimensionally stable support of the flexographic printing plate is a metal support, drying may also take place at higher temperatures, up to around 160° C.

In a method step (e), the resultant flexographic printing plates may where necessary be subjected additionally to a detackifying aftertreatment by means of UVA and/or UVC light. Generally speaking, such a step is advisable. If irradiation is to take place with light of different wavelengths, this may occur simultaneously or else in succession.

Between the individual method steps, the flexographic printing plate is transported on from one unit to the next.

Development may also be accomplished by thermal means. In the case of thermal development, no solvent is used. Instead, following imagewise exposure, the relief-forming layer is brought into contact with an absorbing material and heated.

The invention claimed is:

1. An apparatus for exposing flexographic printing plates comprising a support table for supporting a flexographic printing plate and at least one UV-LED strip which is movable along the surface of the support table or the surface of the flexographic printing plate, the at least one UV-LED strip having at least one ultrasonic sensor for determining the thickness of the flexographic printing plate and optionally the length or the width of the flexographic printing plate or the distance of the at least one UV-LED strip from the surface of the flexographic printing plate.

2. The apparatus of claim 1, the at least one UV-LED strip having the at least one ultrasonic sensor being arranged in the at least one UV-LED strip.

3. The apparatus of claim 1, the at least one UV-LED strip having a plurality of modules of UV-LED-arrays, wherein the at least one ultrasonic sensor is arranged for each module along the side of the at least one UV-LED strip.

4. The apparatus of claim 3, wherein ultrasonic sensors are arranged on both sides of the at least one UV-LED strip.

5. The apparatus of claim 1, wherein the at least one ultrasonic sensor can be displaced along the at least one UV-LED strip.

6. The apparatus of claim 1, wherein the distance of the at least one UV-LED strip can be adjusted relative to the surface of the flexographic printing plate.

7. The apparatus of claim 1, wherein the at least one ultrasonic sensor is connected to a control unit, which controls the exposing of the flexographic printing plate in respect of at least one of the following parameters:
 (i) distance of the at least one UV-LED strip from the surface of the flexographic printing plate,
 (ii) number of exposure steps,
 (iii) exposure intensity,
 (iv) energy input per exposure step,
 (v) duration of the individual exposure steps,
 (vi) overall duration of exposure.

* * * * *